United States Patent
Desu et al.

(10) Patent No.: US 6,495,208 B1
(45) Date of Patent: Dec. 17, 2002

(54) NEAR-ROOM TEMPERATURE CVD SYNTHESIS OF ORGANIC POLYMER/OXIDE DIELECTRIC NANOCOMPOSITES

(75) Inventors: Seshu B. Desu, Amherst, MA (US); John J. Senkevich, Troy, NY (US)

(73) Assignee: Virginia Tech Intellectual Properties, Inc., Blacksburg, VA (US)

(*) Notice: Subject to any disclaimer, the term of this patent is extended or adjusted under 35 U.S.C. 154(b) by 0 days.

(21) Appl. No.: 09/392,944

(22) Filed: Sep. 9, 1999

(Under 37 CFR 1.47)

(51) Int. Cl.⁷ .................. C23C 16/00; C23C 16/40; C23C 16/50; C23C 16/56
(52) U.S. Cl. .................. 427/255.31; 427/561; 427/569; 427/576; 427/255.23; 427/255.28; 427/255.6; 438/780; 438/781; 438/785
(58) Field of Search .................. 427/569, 582–584, 427/248.1, 250, 255.23, 255.28, 255.37, 255.391, 375, 376.2, 561, 564, 576, 255.29, 255.31, 255.33, 255.34, 255.36, 255.6, 567; 438/778, 780, 781, 788, 790, 785

(56) References Cited

U.S. PATENT DOCUMENTS

| 3,268,599 A | 8/1966 | Chow et al. |
| 3,274,267 A | 9/1966 | Chow |
| 3,342,754 A | 9/1967 | Gorham |
| 3,440,277 A | 4/1969 | Holland et al. |
| 4,291,244 A | 9/1981 | Beach et al. ............... 307/400 |

(List continued on next page.)

FOREIGN PATENT DOCUMENTS

| EP | 0 769 788 A2 | 4/1997 |
| JP | 60231442 | 11/1985 |
| WO | WO 97/14666 | 4/1997 |
| WO | WO 97/15699 | 5/1997 |
| WO | WO 97/15951 | 5/1997 |
| WO | WO 98/24743 | 6/1998 |
| WO | WO 98/41490 | 9/1998 |
| WO | WO 99/21706 | 5/1999 |

OTHER PUBLICATIONS

Kudo, et al., Characteristics of Plasma–CF Films for Very Low–K Dielectrics, Feb. 10–11, 1997, DUMIC Conference, 1997 ISMIC—222D/970034, 85–92.

(List continued on next page.)

Primary Examiner—Shrive P. Beck
Assistant Examiner—Wesley Markham
(74) Attorney, Agent, or Firm—Fliesler Dubb Meyer & Lovejoy LLP

(57) ABSTRACT

Nanocomposite thin films with low dielectric constants are made by the simultaneous deposition of an oxide dielectric and an organic polymer at near room temperatures. Suitable oxides include $SiO_2$, and suitable organic polymers include poly(chloro-para-xylylene). The two dielectric materials, when deposited, form nanocomposites characterized by nanometer-sized domains of dielectric material. The nanocomposite thin films of this invention are useful as dielectric layers for interlevel dielectric (ILD) and intermetal dielectric (IMD) dielectrics in the manufacture of semiconductor devices as well as for thin films for flat panel displays, food wraps, hybrid ceramics, glass, hard disk drives, and optical disk drives. Additionally, the invention comprises semiconductor devices and semiconductor chips made incorporating nanocomposites deposited by chemical vapor deposition.

13 Claims, 16 Drawing Sheets

U.S. PATENT DOCUMENTS

| | | | | |
|---|---|---|---|---|
| 4,532,369 | A | 7/1985 | Hartner | 585/428 |
| 4,618,878 | A | 10/1986 | Aoyama et al. | 257/759 |
| 4,737,379 | A | 4/1988 | Hudgens et al. | 427/575 |
| 4,911,992 | A | 3/1990 | Haluska et al. | 428/698 |
| 5,139,813 | A | 8/1992 | Yira et al. | 427/8 |
| 5,158,933 | A | 10/1992 | Holtz et al. | 305/1 |
| 5,210,341 | A | 5/1993 | Dolbier, Jr. et al. | 540/144 |
| 5,268,202 | A | 12/1993 | You et al. | 427/255.6 |
| 5,302,555 | A * | 4/1994 | Yu | 437/235 |
| 5,324,813 | A | 6/1994 | Hougham et al. | 528/353 |
| 5,334,454 | A | 8/1994 | Caporiccio et al. | 428/412 |
| 5,352,487 | A * | 10/1994 | Klinedinst et al. | 427/248.1 |
| 5,420,081 | A | 5/1995 | Mattes et al. | 501/12 |
| 5,424,097 | A | 6/1995 | Olson et al. | 427/255.5 |
| 5,534,068 | A | 7/1996 | Beach et al. | 118/719 |
| 5,536,317 | A | 7/1996 | Crain et al. | 118/664 |
| 5,536,319 | A | 7/1996 | Wary et al. | 118/719 |
| 5,536,321 | A | 7/1996 | Olsen et al. | 118/719 |
| 5,536,322 | A | 7/1996 | Wary et al. | 118/719 |
| 5,536,892 | A | 7/1996 | Dolbier et al. | 570/144 |
| 5,538,758 | A | 7/1996 | Beach et al. | 427/255.6 |
| 5,556,473 | A | 9/1996 | Olsen et al. | 118/719 |
| 5,604,038 | A | 2/1997 | Denes et al. | 428/429 |
| 5,637,395 | A | 6/1997 | Uemura et al. | 428/343 |
| 5,641,559 | A * | 6/1997 | Namiki | 408/216 |
| 5,650,041 | A | 7/1997 | Gotoh et al. | 438/618 |
| 5,759,906 | A | 6/1998 | Lou | 438/623 |
| 5,783,614 | A | 7/1998 | Chen et al. | 532/205 |
| 6,030,706 | A * | 2/2000 | Eissa et al. | 428/421 |
| 6,051,321 | A * | 4/2000 | Lee et al. | 428/447 |
| 6,068,782 | A * | 5/2000 | Brandt et al. | 216/17 |
| 6,086,679 | A | 7/2000 | Lee et al. | |
| 6,143,647 | A * | 11/2000 | Pan et al. | 438/637 |

OTHER PUBLICATIONS

Labelle, et al., Characterization of Pulsed–Plasma Enhanced Chemical Vapor Deposited Fluorocarbon Thin Films, Feb. 10–11, 1997, DUMIC Conference, 1997 ISMIC—222D/97/0034, 98–105.

Lang, et al. Vapor Deposition of Very Low K Polymer Films, Poly(Naphthalene), Poly(Fluorinated Naphthalene), Mat. Res. Soc. Symp. Proc., vol. 381, 45–50, 1995.

McClatchie et al., Low Dielectric Constant Flowfill Technology for IMD Applications, Feb. 10–11, 1997, DUMIC Conference, 1997 ISMIC—222D/97/0034, 34–40.

Robles, et al., Characterization of High Density Plasma Chemical Vapor Deposited –Carbon and –Fluorinated Carbon Films for Ultra Low Dielectric Applications, Feb. 10–11, 1997, DUMIC Conference, 1997 ISMIC—222D/97/0034, 26–33.

Shranagpani, et al., Advantages of Chemical Vapor Deposition Over Conventional Techniques for the Processing of Amorphous Teflon Fluoropolymer, Feb. 10–11, 1997, DUMIC Conference, 1997 ISMIC—222D/97/0034, 117–120.

Shimogaki, et al. How Low Dielectric Constant of F–Doped $SiO_2$ Films Can Be Obtained, Feb. 10–11, 1997, DUMIC Conference, 1997 ISMIC—222D/97/0034, 189–196.

Sugahara, et al. Low Dielectric Constant Carbon Containing $SiO_2$ Films Depositied By PECVD Technique Using a Novel CVD Precusor, Feb. 10–11, 1997, DUMIC Conference, 1997 ISMIC—222D/97/0034, 117–120.

Tamura, et al., Preparation of Stable Fluorine–doped Silicon Oxide Film by Biased Helicon Plasma CVD, Feb. 10–11, 1997, DUMIC Conference, 1997 ISMIC—222D/97/0034, 121–124.

Selbrede, et al., Characterization of Parylene–N Thin Films for Low Dielectric Constant VLSI Applications, Feb. 10–11, 1997, DUMIC Conference, 1997 ISMIC—222D/97/0034, 121–124.

Wang, et al., Parylene–N Thermal Stability Increase by Oxygen Reduction–Low Substrate Temperature Deposition, Preannealing, and PETEOS Encapsulation, Feb. 10–11, 1997, DUMIC Conference, 1997 ISMIC—222D/97/0034, 125–128.

Wary, et al., Polymer Developed to be Interlayer Dielectric, Semi–conductor International, 211–216, Jun. 1996.

Jozef Bicerano, Predition of Polymer Properties, Second Editiona, Marcel Dekker, Inc., pp. 1–15, 50–61, 108–111, and 280–295.

Lee, J. "Transport of Polymerization of Gaseous Intermediates and Polymer Crystals Growth", J. Macromol, Sci–Rev. Macromol. Chem., C16(1), 79–127 (1977–78), no month available.

* cited by examiner

NEAR-ROOM TEMPERATURE CVD SYNTHESIS OF ORGANIC POLYMER/OXIDE DIELECTRIC NANOCOMPOSITES

BACKGROUND OF THE INVENTION

1. Field of the Invention

The field of the invention comprises low dielectric constant nanocomposite materials for use in the semiconductor industry. Specifically, the invention relates to composites containing an oxide such as $SiO_2$ and an organic polymer, such as a poly(chloro-para-xylylene) (PPXC).

2. Discussion of the Related Art

As semiconductor device density increases to permit faster computer operations, the demands on dielectric materials used in semiconductor manufacture becomes greater. The dielectric materials must be good insulators, i.e., must possess high dielectric strength and must possess a low dielectric constant (K). Additionally, as device density increases, the dielectric materials should have sufficient mechanical strength to withstand subsequent processing steps of manufacture, including chemical mechanical polishing. Additionally, the dielectric materials should have sufficient thermal stability to withstand subsequent processing steps and long-term operation at elevated temperatures.

Currently, $SiO_2$ is the most commonly used dielectric material. $SiO_2$ has sufficient mechanical strength and thermal stability. However, $SiO_2$ has a relatively high dielectric constant (K=3.9–4.3) and thus, is not ideally suited for the demand of low dielectric constant high performance sub-0.35 micron semiconductor technologies.

More recently, organic polymeric materials have been proposed for use as dielectric materials in semiconductor manufacturing. Organic polymers include poly(para-xylylenes), or PPX, among others. These organic materials have a lower dielectric constant than $SiO_2$, but have insufficient mechanical strength and thermal stabilities to meet the rigorous demands of semiconductor manufacture.

To provide advantages of both types of dielectric materials, nanocomposite structures have been proposed for use in the semiconductor industry. Nanocomposites of this invention are thin film materials characterized by the existence of mixtures of individual domains of dielectric materials, each being in the size range of from about 20 Å to about 200 nm.

Several methods have been proposed to synthesize nanocomposite and intercalative layered structures and the different polymer and ceramic constituents in these composites. One currently available process for manufacturing nanocomposite materials utilizes sol-gel methods {Mattes et al., U.S. Pat. No. 5,420,081, herein incorporated fully by reference. Another method utilizes sputtering methods {Holtz et al., U.S. Pat. No. 5,158,933, herein incorporated fully by reference}. {Gonsalves et al., Mat. Res. Soc. Symp. Proc. 435:55–65 (1996)}. Using these methods a chemical link is formed between the ceramic and organic phases and therefore may produce desired properties in the bulk nanocomposite or nanocomposite coating.

However, a chemical bond between ceramic and organic phases is not a prerequisite for enhanced material properties, especially when interpenetrating phases are present on the order of the nanometer size range. At the size of the crystallites within a nanophase structure, molecular interactions may take place which affect the large scale properties of the films. Nanocomposites which are made by solution or melt-based methods rely on good thermodynamic mixing or molecular dispersion to make effective nanoscale blends.

However, the solution-based and sol-gel based processes are not well suited for the manufacture of semiconductors with sub-micron feature sizes. With device features of 0.35 µm and less, the thickness and conformality of the dielectric layers must be very carefully controlled, and the compositions of each phase must be reproducible. Bulk mixing of components is unsatisfactory for achieving this aim.

Additionally, sputtering, conventional thermal CVD, and plasma enhanced chemical vapor deposition (PECVD) methods can be used to co-deposit dielectric materials. However, they are poorly suited for depositing nanocomposites with widely different physical properties because deposition conditions may be very different for each material in the composite. For example, the typical CVD deposition of $SiO_2$ occurs at high temperatures (above 350° C.), whereas deposition of organic polymers such as poly(para-xylylenes) can take place at temperatures well below 100° C. Therefore, current manufacturing methods do not permit the deposition of dielectric materials as thin films of differing physical and chemical properties.

So far, however, no CVD method has been developed to synthesize nanocomposite thin film materials. The lack of these methods has inhibited the use of nanocomposite materials for thin film applications, especially those related to the electronics industry. Therefore, new methods are needed for accurately and reproducibly producing thin film nanocomposites for semiconductor manufacturing.

SUMMARY OF THE INVENTION

Thus, one object of the invention is the development of methods for manufacturing nanocomposite thin films with low dielectric constant, high dielectric strength, high thermal stability, and high mechanical strength.

Another object of the invention is to provide methods for the co-deposition of different semiconductor materials which have different physical and chemical properties.

A further object of the invention is to provide semiconductor device thin films comprising nanocomposites made by co-depositing dielectric materials.

An additional object of the invention is the manufacture of nanocomposites comprising organic co-polymers.

A further object of the invention is the manufacture of nanocomposites comprising cross-linked oxide and organic polymers.

Another object of the invention is the manufacture of nanocomposites at near or below room temperatures using chemical vapor deposition.

Yet another object of the invention is to manufacture graded films of oxide and organic polymeric dielectric materials of varying ratios.

Another object of the invention is the manufacture of semiconductor wafers comprised of nanocomposites deposited by chemical vapor deposition.

A further object of the invention is the manufacture of semiconductor devices with nanocomposite thin films deposited by chemical vapor deposition.

According to the invention, new methods are disclosed which can be used to deposit novel semiconductor thin films in the form of nanocomposites using chemical vapor deposition of oxide and organic polymer materials which co-deposit to form the thin film.

Thus, one aspect of the invention is an apparatus for co-depositing different dielectric materials simultaneously.

Another aspect of the invention is the co-deposition of oxide and organic polymeric dielectric materials to form nanocomposites.

An additional aspect of the invention is the deposition of nanocomposite thin films with low dielectric constant, high dielectric strength, high thermal stability and high mechanical strength.

Another aspect of the invention is the deposition of nanocomposite dielectric materials as semiconductor device thin films.

An additional aspect of the invention is the manufacture of nanocomposites comprising organic co-polymers.

A further aspect of the invention is the manufacture of nanocomposites comprising cross-linked oxide and organic polymers.

Yet another aspect of the invention is to manufacture gradient films of oxide and organic polymeric dielectric materials of varying ratios.

DETAILED DESCRIPTION

Figure 1:
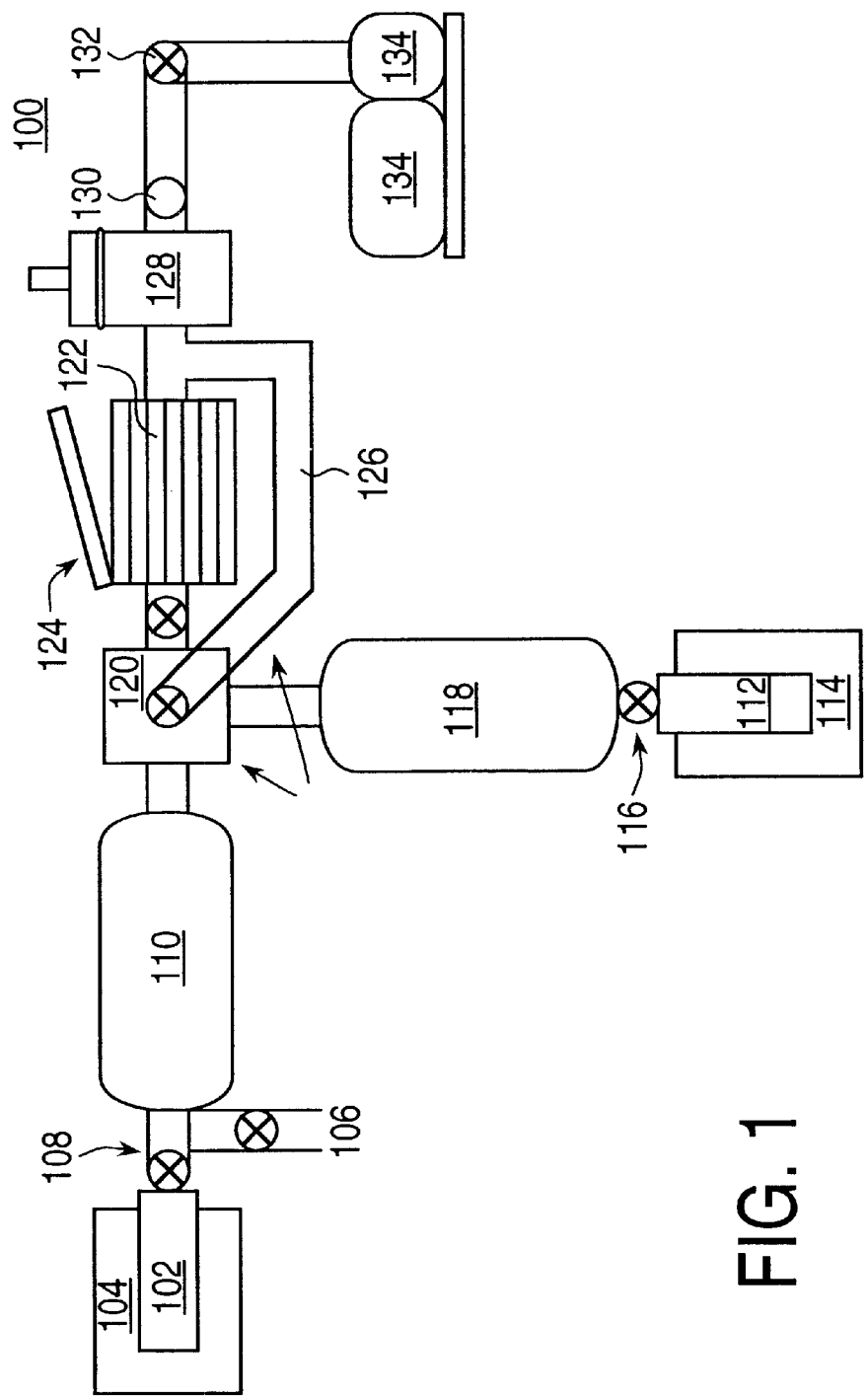
FIG. 1 is a depiction of apparatus of the invention for chemical vapor deposition of oxide and organic polymeric nanocomposites with separate arms for dissociation of each type of precursor.

This invention describes nanocomposites deposited by chemical vapor deposition (CVD) and methods for their manufacture. A "nanocomposite" as herein defined means a material comprising two or more different materials, each having its own characteristics, into a composite having desirable properties, and wherein the domains of each separate material can have of a size on the order of about 20 Å to about 200 nm. The term "crystallite" as defined herein means a separate domain of a material within a nanocomposite that is arranged in an ordered fashion. Nanocomposites of this invention are made of an oxide material and an organic polymer in which small domains of individual polymers can be interspersed with each other and can be closely associated so as to produce thin films with low dielectric constant (K), high dielectric strength, high thermal stability (Td), high glass transition temperature (Tg), and high mechanical strength. The sizes of the individual polymer domains can be in the range of about 20 Å to about 200 nm in size. Manufacture of nanocomposites by CVD processes can involve the dissociation of precursors into reactive intermediates, transport of reactive intermediates into a deposition chamber, and deposition of a polymer film onto a substrate such as a semiconductor wafer.

I. Dissociation of Precursors and Polymerization of Thin Films

The manufacture of nanocomposites can be accomplished using a CVD apparatus comprising dual dissociation chambers in which the following sequence of reactions occurs. Any dielectric material which can be deposited according to the same sequence of reactions is useful. By way of example only, the reaction sequence for the deposition of $SiO_2$ is shown. The $SiO_2$ is deposited from the alkoxy silane precursor (A) as:

Ea1

$$A \rightarrow B^* + \text{By-products} \quad \text{(Reaction 1)}$$

Ea2

$$B^* \rightarrow SiO_2 + \text{By-products} \quad \text{(Reaction 2)}$$

where Ea1 and Ea2 represent the activation energies of Reactions 1 and 2, respectively. In the above reactions B* is the activated intermediate species. Ideally, the by-products produced by these reactions should not be incorporated into the thin film. However, if they are incorporated into the film, the by-products should not deleteriously affect the properties of the film. One theory to account for the ability of $SiO_2$ to be deposited at near-room temperature is first, that alkoxysilanes such as diacetoxy-di-t-butoxysilane (DADBS) or tetraethylorthosilane (also termed tetraethylorthosilicate or TEOS), when dissociated, can form relatively long-lived reactive intermediate species. These species can then transported to another chamber where the reactive intermediates polymerize to form polymers of the nanocomposite thin film. A second aspect of this theory is that a difference exists in the activation energies between Reaction 1 and Reaction 2. Specifically, Reaction 1 has a high activation energy Ea1 due to the requirement for breaking covalent bonds, whereas Reaction 2 has a low activation energy Ea2 due to bond formation. However, according to this theory, Reaction 2 should occur at a reasonable rate at the desired deposition temperature and pressure. This is only one possible theory to account for the observations. Other theories may explain the phenomena, and this invention is not limited to any particular theory for operability.

A. Apparatus Used for Manufacture of Nanocomposites and Dissociation of Precursors In one embodiment of the apparatus for the manufacture of nanocomposites, pyrolysis chambers can be used to dissociate the precursors. FIG. 1 shows a schematic of the reactor 100 for making nanocomposite films using thermal CVD, with separate sublimation/vaporization chambers and pyrolysis tubes for the dissociation of the oxide and organic precursors of the nanocomposite films. A precursor of a oxide phase dielectric material, such as the alkoxysilane precursor 112 is held in a precursor holder 114 which can be heated to evaporate the precursor 112. Precursors of any oxide dielectric can be suitable with this dissociation apparatus. By way of example only, DADBS or TEOS can be used to deposit $SiO_2$. The vaporized oxide precursor passes through a tube 116 warmed to prevent deposition of the precursor on the tubing, and then into the pyrolysis chamber 118 which can be heated to a temperature sufficiently high to dissociate the precursor into reactive intermediates.

Similarly, to dissociate the organic phase precursor of the nanocomposite, a precursor of an organic polymer 102 is placed in another sublimation chamber 104. The precursor can be heated to a sufficiently high temperature to volatilize the precursor. The sublimated precursor then flows through a tube 108 which is heated to prevent deposition of the precursor on the walls of the pipe. Chamber vent 106 can be used to equalize the pressure between the interior of the chamber and the atmosphere prior to removing the thin films from the chamber.

After dissociation of precursors, the reactive intermediates are introduced into the deposition chamber 122 by a valve 120. The chamber 122 has a door 124 through which the wafers or other substrates such as food wraps, flat panel displays, glass, hybrid ceramics, hard disk drives, and optical disk drives can be placed into and removed from the chamber 122. A bypass tube 126 can divert flow from the dissociation chambers while the chamber 122 is open. A cold trap 128 can keep precursors and bias gases from contaminating pump 134, which is connected to the cold trap by a valve 132. The pressure in the deposition system is monitored by a pressure gauge 130.

Pressures within the sublimation chambers can be in the range of from about 1 milliTorr to about 1 Torr, alternatively from about 0.01 Torr to about 0.3 Torr, and in another embodiment from about 0.02 Torr to about 0.15 Torr. The flow rate of the precursor can be controlled by the temperature of sublimation. By way of example only, at a sublimation pressure of 80 milliTorr, sublimation of DADBS can be performed at temperatures in the range of from about 30° C. to about 110° C., alternatively from about 50° C. to about 100° C., and in another embodiment from about 60° C. to about 90° C. Typically, the temperature ranges for sublimation of the organic phase precursor can be from about 90° C. to about 170° C., alternatively from about 120° C. to about 160° C., and in other embodiments from about 140° C. to about 145° C. The relative amounts of each component of the nanocomposite can be regulated by controlling the temperature of volatilization. Increasing the temperature in the vaporization chamber can volatilize more precursor, can increase the amount of precursor entering the pyrolysis chamber, and thereby can increase the proportion of that component in the final film.

The sublimated organic phase precursor passes into the pyrolysis chamber 110, where the organic material is vaporized and can be pyrolyzed at temperatures in the range of about 550° C. to about 750° C., alternatively from about 575° C. to about 700° C., and in other embodiments at about 600°, depending on the precursor sublimation rate. In addition to thermal CVD, plasma enhanced CVD and laser enhanced CVD methods can be used to dissociate the precursors to manufacture nanocomposites. These methods are known in the art and will not be discussed further.

B. Deposition of Polymers

Figure 2:
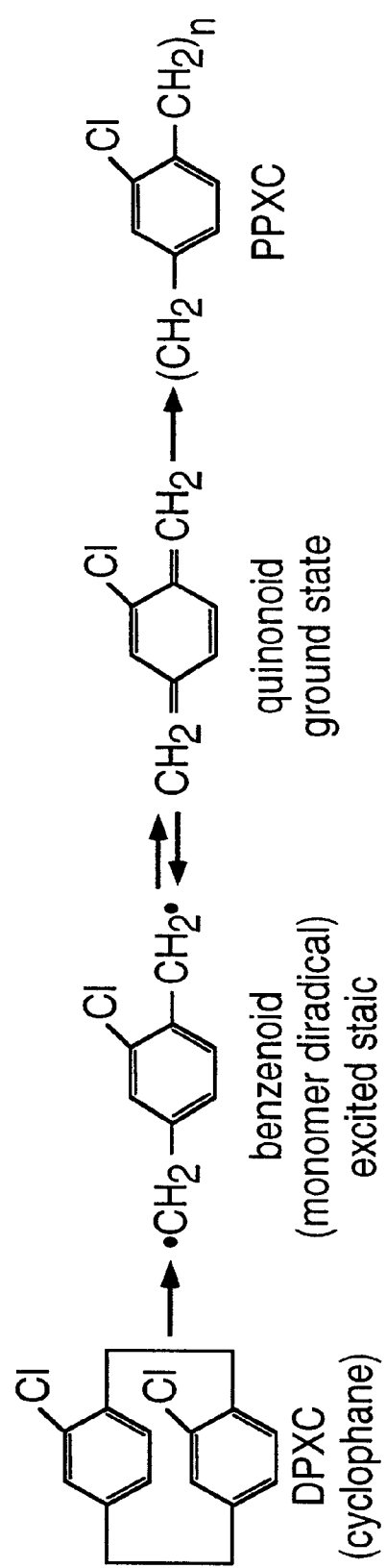
FIG. 2 shows the chemical reactions leading from di-para-chloroxylylene to a poly(chloro-para-xylylene).

FIG. 2 shows the chemical reactions involved in the synthesis of polymers of PPXC. The dimer precursor, DPXC is heated to generate the monomer diradical benzenoid intermediate, which is in equilibrium with the quinonoid, or ground state, intermediate, which then can condense spontaneously at deposition temperatures to form the PPXC film.

After the precursors are dissociated, the reactive intermediates then pass through a mixing valve 120, which mixes the dissociated precursors prior to their injection into the deposition chamber 122. The valve 120 is heated to a temperature sufficient to prevent deposition of intermediates or polymers on the apparatus. By way of example only, if DPPX is the precursor, the temperature of the mixing valve and tubing can be set to about 210° C.

The flow rate of the intermediates can be regulated to achieve a deposition rate of $SiO_2$ in a desired range of from about 1 nm/min to about 30 nm/min, alternatively from about 3 nm/min to about 12 nm/min, and in other embodimnets, about 4 nm/min. The flow deposition rate for the organic phase polymer can be in the range of about 1 nm/min to about 30 nm/min, alternatively from about 5 nm/min to about 20 nm/min, and in additional embodiments about 15 nm/min.

Gradient films can be manufactured using the methods of this invention by decreasing the flow rate of one precursor and/or increasing the flow rate of another precursor. In this way, the composition of the deposited film can be varied continuously. Such gradient films can have gradients of indices of refraction, gradients of dielectric constant, and gradients of mechanical strength, as reflected in graded elastic and/or shear moduli. The use and manufacture of gradient films also can eliminate the need to separately deposit intermetal dielectric and diffusion barrier layers. By using the methods of this invention, one can deposit these different types of layers in one step. By way of example only, the ratio of oxide and organic polymer can be in the range of about 0.053:1 to about 19:1, alternatively in the range of about 0.25:1 to about 4:1, and in other embodiments, in the range of about 0.6:1 to about 1.5:1.

Deposition times depend on the desired thickness of the dielectric layer and the rates of sublimation of precursors. Typically, deposition of nanocomposites can be performed for from about 5 min to about 2 hours, alternatively from about 10 minutes to about 60 minutes, and in other embodiments, for about 20 minutes.

The substrates used for depositing the nanocomposite films can be of any material known in the art. By way of example only, wafers of silicon (111), silicon (100), $CaF_2$, thermal oxide, aluminum coated Si, platinum coated Si, copper coated Si, or organic polymers are suitable. Additionally, the nanocomposite thin films of this invention can be deposited onto other substrates such as food wraps, flat panel displays, glass, hybrid ceramics, hard disk drives, and optical disk drives. These substrates can be dried under nitrogen and then placed in the deposition chamber 122 and can be held in place on a substrate holder (not shown). After loading the deposition chamber 122, the door 124 can be closed, and the system pressure can be maintained at a pressure in the range of about 0.01 Torr to about 1 Torr using pump 134. The pressure can be monitored using a pressure gauge 130, connected to the pump 134 via a pipe with a valve 132. Valve 132 can prevent oil from back-streaming when the pump is turned off and the reactor is vented to the atmosphere.

The substrate is desirably maintained at a temperature below the threshold temperature for deposition of both reactive intermediates. For deposition of $SiO_2$, temperatures in the range of about 20° C. to about 700° C. are suitable. Deposition of organic polymers occurs at lower temperatures, typically from about 20° C. to about 100° C. In the deposition chamber, the reactive intermediates can physiosorb at the substrate and to each other thereby forming polymer domains of one type of that type of pure dielectric material. Nearby areas of the substrate are foci for the formation of polymer domains of the other type of dielectric material or of other domains of the same type of dielectric material. As the polymer domains grow, they ultimately make contact with each other, forming the nanocomposite thin film.

C. Oxide Dielectric Materials

Many different dielectric materials can be used to make the nanocomposites of this invention. In general, the oxide polymer should have high thermal and mechanical stability, should be dissociable into reactive intermediates which can be transported in the gas phase, and should be able to polymerize on suitable substrates at temperatures below the threshold temperatures of the organic phase polymers. Generally, any oxide can be deposited using the methods of this invention which have the following general formula:

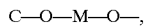

where M is a metal atom, O is an oxygen atom, and C is an organic ligand. Typically, suitable oxides can include silicates such as $SiO_2$, or other oxides such as $Al_2O_3$, $Y_2O_3$, $TiO_2$, $ZrO_2$, $Ta_2O_5$, $Nb_2O_5$, or ZnO. This list is by way of example only and is not intended to be limiting.

Typical precursors for the deposition of $SiO_2$ include alkoxysilane precursors, DADBS ($C_{12}H_{24}O_6Si$), TEOS ($C_8H_{20}O_4Si$), tetraacetoxysilane ($C_8H_{12}O_8Si$), tetramethoxysilane (TMOS), tetraallyloxysilane ($C_{12}H_{20}O_4Si$), tetra-n-butoxysilane ($C_{16}H_{36}O_4Si$), tetrakis(ethoxyethoxy)silane ($C_8H_{36}O_8Si$), tetrakis(2-ethylhexoxy)silane ($C_{32}H_{68}O_4Si$), tetrakis(2-methoxycryloxyethoxy)silane ($C_{24}H_{36}O_{12}Si$), tetrakis(methoxyethoxyethoxy)silane ($C_{20}H_{44}O_{12}Si$), tetrakis(methoxyethoxy)silane ($C_{12}H_{28}O_8Si$), tetrakis(methoxypropoxy)silane ($C_{16}H_{36}O_8Si$), and tetra-n-propoxysilane ($C_{12}H_{28}O_4Si$).

Typical precursors for the deposition of other metal oxides include, by way of example only, aluminum (III) n-butoxide, yttrium isopropoxide, titanium-di-n-butoxide (bis-2,4-pentanedionate), zirconium isopropoxide, tantalum (V) n-butoxide, niobium (V) n-butoxide, and zinc n-butoxide.

D. Organic Polymer Dielectric Materials

Precursors for organic polymers can be dissociated in fashions similar to those used for oxide dielectric materials. A precursor can be volatilized and dissociated to form reactive intermediates in a dissociation chamber, typically using heat generated by a resistive heater, and the reactive intermediates can then carried to the deposition chamber.

Organic polymers are selected to have threshold polymerization temperatures sufficiently low to permit co-deposition with the oxide. The threshold temperature is defined herein to mean the temperature above which the growth rate of the polymer nears zero. The threshold temperature can be a function of the molecular weight and molecular structure of the polymer.

Examples of suitable polymers include poly(para-xylylenes). Poly(para-xylylenes) are typically deposited from dimers using the Gorham method U.S. Pat. No. 3,342,754, incorporated herein fully by reference. Poly(para-xylylenes) include poly(chloro-p-xylylene) (PPXC), poly(dichloro-p-xylylene (PPXDC), and poly(tetrafluoro para-xylylene) (PTFPX), poly(dimethoxy-para-xylylene), poly(sulfo-para-xylylene), poly(iodo-para-xylylene), poly (α,α, α', α', tetrafluoro-para-xylylene), poly(trifluoro-para-xylylene), poly(difluoro-para-xylylene), and poly(fluoro-para-xylylene). However, any poly(para-xylylene) polymer could be used to make the homopolymeric nanocomposite thin film synthesized here. Examples of other poly(para-xylylenes) are included in Salome, *Polymeric Materials Encyclopedia,* CRC Press, Boca Raton, Fla. (1996), herein incorporated fully by reference. Further, poly(N-phenylmaleimide) can be used.

Additionally, to manufacture organic phases comprising organic phase copolymers, the following materials are suitable: poly(maleimide/parylene) copolymer, poly acenaphthalene/parylene copolymer, divinylbenzene/parylene copolymer, perfluorooctylmethacrylate (PFOMA)/parylene copolymer, 4-vinyl biphenyl/parylene copolymer, 9-vinylanthracene/parylene copolymer, maleic anhydride/parylene copolymer, N-vinyl pyrrolidone/parylene copolymer, 4-vinylpyridine/parylene copolymer, styrene/parylene copolymer, buckminsterfullerene/parylene copolymer, and trihydroperfluoroundecylmethacrylate/parylene copolymer.

Additionally, cross-linked organic phase copolymers can be used to manufacture the organic phase of nanocomposites. By way of example only, the following are useful: 2,3,5,7, tetravinyl, 1,3,5,7, tetramethylcyclotetrasiloxane/parylene, 1,3,5, trivinyl, 1,3,5, trimethylcyclotrisiloxane/parylene, tetravinylsilane/parylene/parylene, and 1,1,3,3, tetravinyldimethyldisiloxane/parylene.

Furthermore, covalent $SiO_2$-organic polymer phases can be used, and can include, by way of example only, vinyl triethoxysilane/parylene, vinyl triacetoxysilane/parylene, and vinyl tri-t-butoxysilane.

It is understood that the above materials are by way of example only, and are not intended to limit the scope of the invention.

E. Low Temperature Deposition of Dielectric Materials to form Nanocomposites

After pyrolysis, the reactive intermediates from each pyrolysis chamber are transported to another, single chamber for deposition. Typically, the range of temperatures in the deposition chamber can be between about −170° C. and about 130° C., depending on the polymer deposited. By way of example only, for $SiO_2$/poly(chloro-p-xylylene) nanocomposites, the temperatures are desirably between about 60° C. and 90° C., and in other embodiments, about 80° C. PPXC can polymerize at temperatures from about −170° C. to about 90° C. Poly(dichloro-p-xylylene) (PPXD) has a threshold temperature of about 130° C. and poly(para-xylylene) (PPXN) has a threshold temperature of about 40° C. Above these threshold temperatures, polymers will not form spontaneously from reactive intermediates.

The deposition of a thin film can take place at pressures in the range of about 0.01 Torr to about 760 Torr, alternatively from about 0.05 Torr to about 0.2 Torr, and in alternative embodiments at about 0.08 Torr. The pressure can be chosen to optimize the rates of deposition of both polymers and oxide, and to maximize the formation of polymers and oxide nanocomposites. If the pressure in the deposition chamber is too high, reactive intermediates can interact in the gas phase and can form powders or porous thin films. If the pressure in the deposition chamber is too low, the rate of deposition can be too low and the manufacturing process can become undesirably inefficient.

The overall composition of the nanocomposite thin film can be varied by controlling the relative amounts of each type of precursor used. For example, a thin film with a high oxide nanocomposite can be made with up to about 95% oxide, and a thin film with an organic polymer rich nanocomposite can be made with up to about 95% organic polymer. Therefore, any desired ratio of oxide to organic polymer can be made according to this invention. Increasing the relative amount of organic polymer can decrease the dielectric constant, can decrease the glass transition temperature (Tg), the decomposition temperature (Td) and the mechanical stability (G) of the material. Workers of ordinary skill in the art can chose relative percentages of the oxide and organic components to achieve nanocomposite thin films exhibiting desired properties either to produce a certain desired composition of the nanocomposite or a gradient film.

The thickness of the nanocomposite thin film can be adjusted by varying deposition time, precursor flow rate and deposition temperature. Typically, films can be deposited for sufficient time to achieve the desired thickness. By way of example only, at a deposition rate of 100 Å/min, a film 100 Å in thickness can be deposited in about 1 min, and films of about 200 Å in thickness can be deposited in about 2 minutes.

A nanocomposite comprising $SiO_2$ can be slower to crystallize compared to the homopolymer due to the presence of $SiO_2$ and its constraining effect on the formation of domains of PPXC. Moreover, nanocomposite manufacture requires longer deposition times than homopolymers of poly(para-xylylenes). Furthermore, nanocomposites containing higher $SiO_2$ content can deposit more slowly than nanocomposites composed of lower amounts of $SiO_2$. One theory to account for this difference is a restraining effect exerted by the $SiO_2$ upon the poly(para-xylylenes) during polymerization.

Because deposition of $SiO_2$ can depend on the substrate surface (known as "surface sensitivity"), one can also reduce the surface sensitivity by pre-cleaning the semiconductor substrate prior to deposition. Such pre-cleaning may be done using HF or any other method known in the art.

F. Post-Deposition Processing

The chemical and physical characteristics of nanocomposite thin films can be varied by post-deposition processing. Such processing can include annealing steps carried out at temperatures above those used for deposition. Post-deposition annealing can alter the crystallite structure of the nanocomposites. By way of example, heating a thin film to a temperature above the deposition temperature but below the melting temperature and subsequently cooling the thin film can cause the crystal structure to become denser and more tightly packed. This can increase the mechanical strength of organic polymers. However, heating nanocomposite thin films to temperatures above the melting temperature can disrupt the crystal structure, thereby creating an amorphous thin film.

The invention is further described by reference to the Examples.

EXAMPLES

Example 1

Deposition of Nanocomposite Films of $SiO_2$ and PPXC
Deposition of nanocomposite films of $SiO_2$ and PPXC was accomplished using a reactor shown in FIG. 1. The reactor had separate sublimation/vaporization chambers, where the precursors for the $SiO_2$ (DADBS) and the PPXC (DPXC) were introduced. The silane precursor DADBS was placed in the vaporization chamber and vaporized from 69° C. to 89° C.

The DPXC was placed in the sublimation chamber and sublimed at 116° C. to 119° C. to achieve a deposition rate of 2.2 to 7.5 nm/min for the nanocomposites. The DADBS pyrolysis chamber and the DPXC pyrolysis chamber were heated to 615° C. and 600° C., respectively, to convert the precursors into the reactive intermediates.

After pyrolysis, the reactive intermediates of each species were mixed in the valve (heated to 210° C.). The reactive intermediate mixture was transported to the deposition chamber where they deposited at 80° C. to 85° C. to form nanocomposite films. The depositions lasted between about 20 minutes and about 70 minutes, depending on the type of analysis needed, at a base pressure of 0.105 Torr–0.120 Torr. The substrates used for depositing the nanocomposite films were (111) silicon. The silicon wafers were cut by a carbide scribe into dimensions roughly 1.5×2 cm. These substrates were exposed to a 0.05% HF solution for 5 minutes to etch the native oxide, the liquid was blown off with dry nitrogen and the wafer was placed in the deposition chamber.

Figure 3:
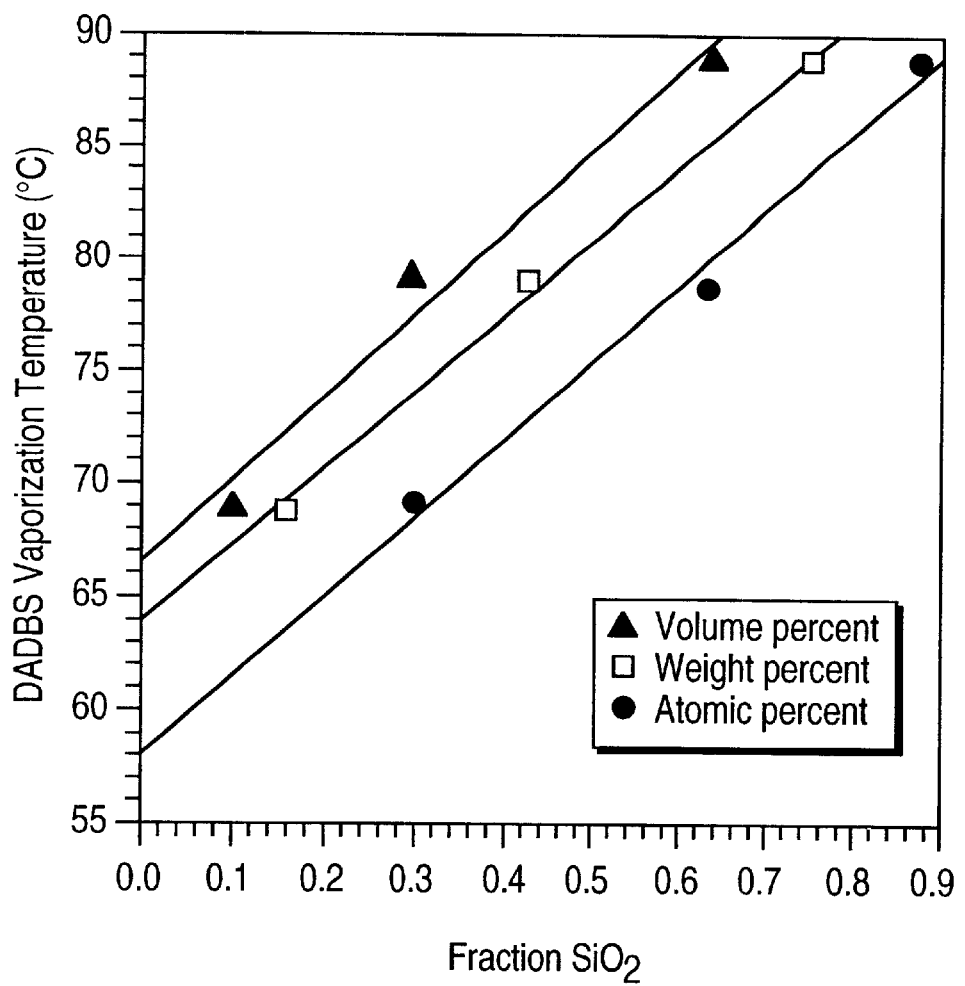
FIG. 3 shows the dependence of $SiO_2$ content of 3 thin nanocomposite films on the vaporization temperature of the precursor diacetoxy-di-t-butoxysilane (DADBS).

Films with three different $SiO_2$/PPXC ratios were made by adjusting the temperature of the volatilization chamber. At a vaporization temperature of 69° C., the $SiO_2$ content of a nanocomposite film was about 16 wt % (□; FIG. 3). Increasing the temperature in the volatilization chamber to 79° C. or 89° C. increased the weight percentage of $SiO_2$ in the nanocomposite to about 42 wt % and about 74 wt %, respectively.

Example 2

Chemical Structure of Nanocomposite Thin Films

Fourier Transformed Infrared spectroscopy ("FTIR") provides qualitative chemical information of the bonds present in the thin film. Quantifying the infrared spectra can be difficult since adsorption bands can show non-linear behavior as a function of concentration, and some adsorption bands are much more intense than comparative bands in other materials. A Perkin Elmer model 1600 FTIR spectrometer was used for infrared spectroscopic measurements. A $CaF_2$ single crystal substrate was used for the nanocomposite films, silicon dioxide films, and PPXC films. These films were analyzed from 4000 $cm^{-1}$ to 880 $cm^{-1}$. The IR spectrum of DADBS was analyzed from 4000 $cm^{-1}$ to 625 $cm^{-1}$ after preparing a neat cell consisting of NaCl single crystals. X-ray diffraction data was obtained using a Scintag XKDS-2000 (Sunnyvale, Calif.) X-ray diffractometer with Cu Kα1 of 1.54059 Å. Scans were made from 10° to 24° 2θ at a scan rate of 2° 2θ/min for both PPXC and the nanocomposite films. The thickness of the PPXC and nanocomposite films used for XRD were 246 nm and 719 nm, determined by variable angle spectroscopic ellipsometry (VASE) using an isotropic Cauchy model. Compositional analysis of the nanocomposite samples were accomplished by wavelength dispersive X-ray analysis (WDXA), which showed a 0.57 fraction of PPXC for the transmission electron microscope sample.

Figure 4:
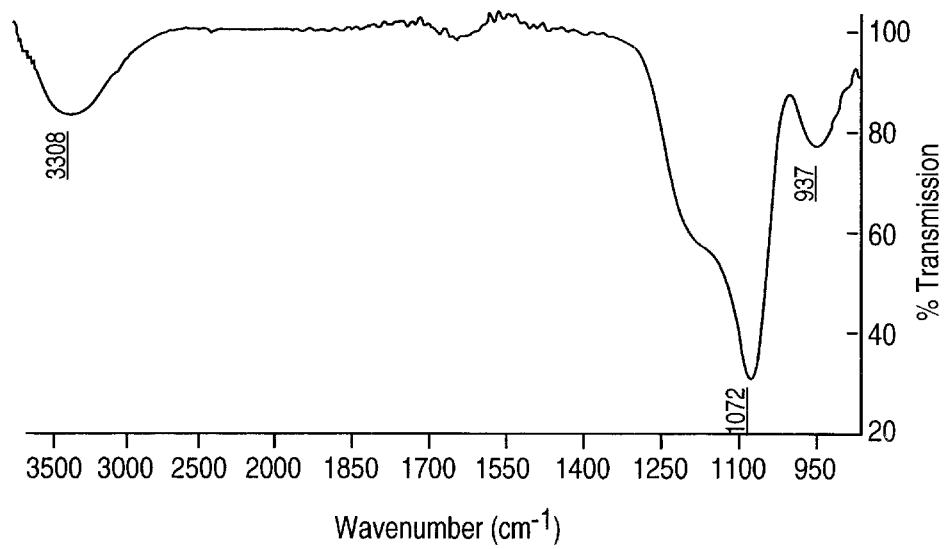
FIG. 4 shows the Fourier Transformed Infra Red (FTIR) spectrum of a thin film of $SiO_2$ deposited at near room temperature from the precursor DADBS.

FIG. 4 shows the IR spectrum of a pure film of $SiO_2$ deposited at 71° C. to 72° C. from DADBS vaporized at a temperature of 87° C. Three peaks are present, at 937 $cm^{-1}$, 1072 $cm^{-1}$, and 3308 $cm^{-1}$. The peak at 1072 $cm^{-1}$ can be due to asymmetrical stretching of Si—O—Si bonds, and is also called the transverse optical (TO) mode, and can represent $SiO_2$. The peak at 1072 $cm^{-1}$ has a characteristic asymmetrical hump and can be de-convoluted using Fourier transformation into three separate peaks. The asymmetry of the peak at 1072 $cm^{-1}$ can be due to either nonstoichiometry (SiOx where x<2) or hydrolyzed Si—O bonds. An alternative theory is that the peak at 1072 cm$^{-1}$ is antisymmetrically broadened due to the porosity of the SiO$_2$ film. The peak at 3308 cm$^{-1}$ can be due to —OH stretch, and the peak at 937 cm$^{-1}$ can be due to the Si—OH stretch. The Si—OH stretch can also appear at wavenumbers between 3600 cm$^{-1}$ and 3200 cm$^{-1}$ but in this case, any Si—OH stretch was apparently obscured by the large—OH stretch at 3308 cm$^{-1}$.

The large peak at 3308 cm$^{-1}$ can be due to the adsorption of infrared radiation by water adsorbed into the film after polymer deposition. The by-products acetic acid and t-butanol from the decomposition of DADBS can also absorb infrared radiation in this range due to the carboxylic acid group of acetic acid and the alcohol group of t-butanol. However, the major adsorption peak of t-butanol is at 2963 cm$^{-1}$ and here was represented in the SiO$_2$ film as only a minor distortion. The major adsorption peak of acetic acid can be broad, is centered at 1709 cm$^{-1}$, and can be due to the absorption of IR radiation by the carbonyl group. However, because there is only a minor distortion in the IR spectrum of the SiO$_2$ film, little acetic acid is apparently present in the film.

Figure 5:
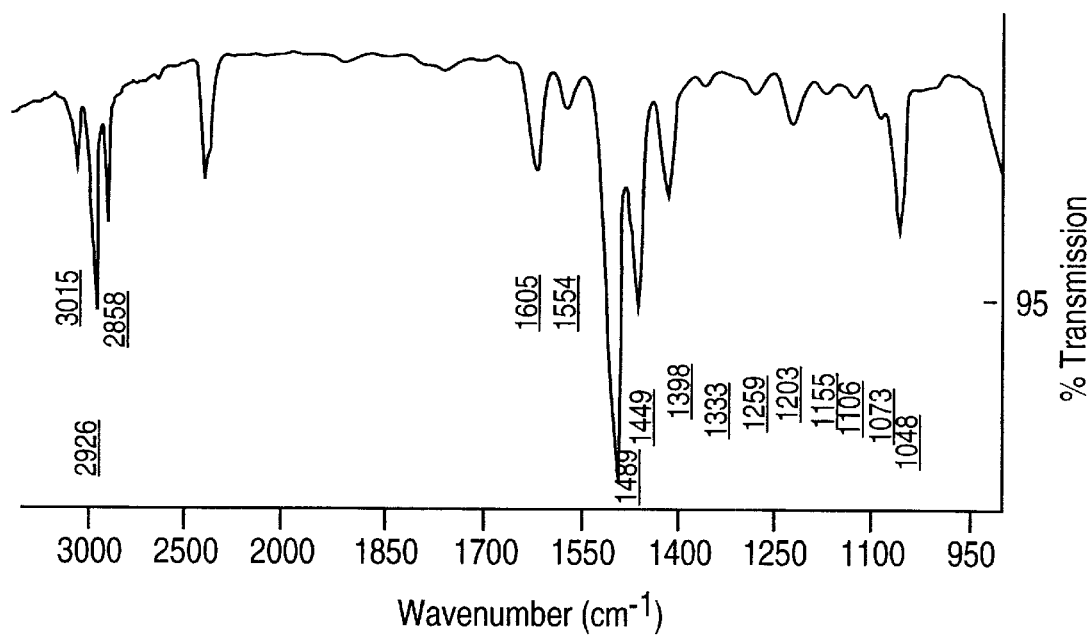
FIG. 5 is the FTIR spectrum of a thin film of PPXC deposited on a $CaF_2$ substrate.

FIG. 5 shows the IR spectrum, measured from 880 cm$^{-1}$ to 3200 cm$^{-1}$, of a 257 nm thin film of PPXC deposited on CaF$_2$. Two sets of observed peaks can be characteristic of PPXC. The group at 3015 cm$^{-1}$, 2926 cm$^{-1}$, and 2858 cm$^{-1}$ can be due to —CH stretching. The group is split into three peaks, possibly because of the different —CH bonding which can occur in the PPXC monomer. The other set of peaks distinguishing PPXC are the group at 1489 cm$^{-1}$, 1449 cm$^{-1}$ and 1398 cm$^{-1}$. These peaks can be due to C—H bending and C—C stretching. The peak at 1605 cm$^{-1}$ can be characteristic of aromatic C—C stretching and is normally small compared to the other adsorption peaks in an IR spectrum. The peak at 1048 cm$^{-1}$ can br due to stretching of covalent C—O bonds, the peak at 1203 cm$^{-1}$ can be characteristic of aromatic residues, and the peak at 1554 cm$^{-1}$ can be due to C—Cl stretching.

Figure 6:
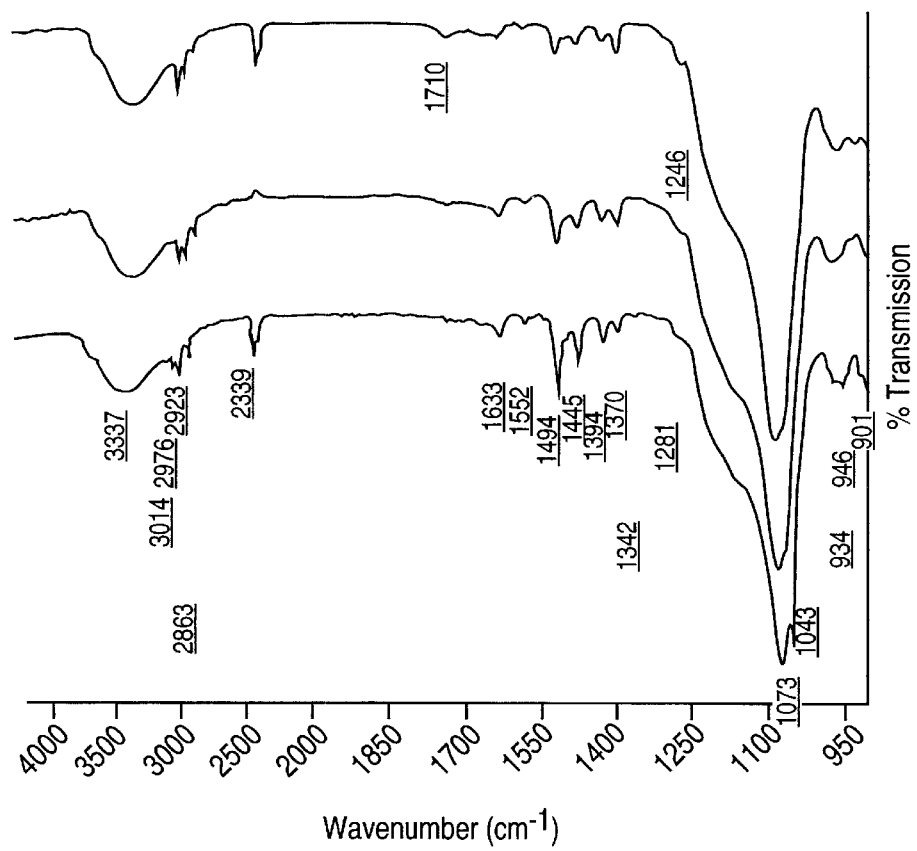
FIG. 6 shows the FTIR spectra of nanocomposite films made with different ratios of $SiO_2$ and PPXC.

FIG. 6 shows IR spectra of three different nanocomposite thin films made with decreasing weight fractions of SiO$_2$: of 0.76 wt %, 0.43 wt %, and 0.16 wt %, respectively, from top to bottom. The largest peaks are at 1073 cm$^{-1}$, and have the characteristic asymmetrical shape of SiO$_2$. The small peaks at 1494 cm$^{-1}$, 1448 cm$^{-1}$ and 1398 cm$^{-1}$ represent PPXC. Based solely on the relative heights of the peaks seen in FIG. 6, one might conclude that SiO$_2$ is the dominant constituent of these films. However, SiO$_2$ can be strongly absorbing at 1072 cm$^{-1}$ whereas PPXC does not absorb infrared radiation as strongly as does SiO$_2$. Therefore, the relative size of the peaks is not necessarily an accurate reflection of the relative amounts of SiO$_2$ and PPXC in the films. Instead, wavelength dispersive X-ray analysis (WDXA) can more accurately indicate the relative proportions of SiO$_2$ and PPXC in the nanocomposite films (FIG. 3). The peaks at 3308 cm$^{-1}$ in FIG. 4 and at 3337 cm$^{-1}$ in FIG. 6 can be due to Si—OH and —OH from adsorbed H$_2$O. If any carboxylic acid group were in the film, the peak at 3308 cm$^{-1}$ would be expected to be shifted to lower wavenumbers, about 3000 cm$^{-1}$ due to the polar carbonyl group adjacent to the —OH group. The absence of a significant peak at these lower wavenumbers can indicate the presence of little acetic acid in the films.

A broadened peak at 1248 cm$^{-1}$ skewed to higher wavenumbers, if present, can be due to the presence of t-butanol in the film. The absence of any peak at 1248 cm$^{-1}$ indicates that there is little, if any, t-butanol in those nanocomposite films.

Figure 7:
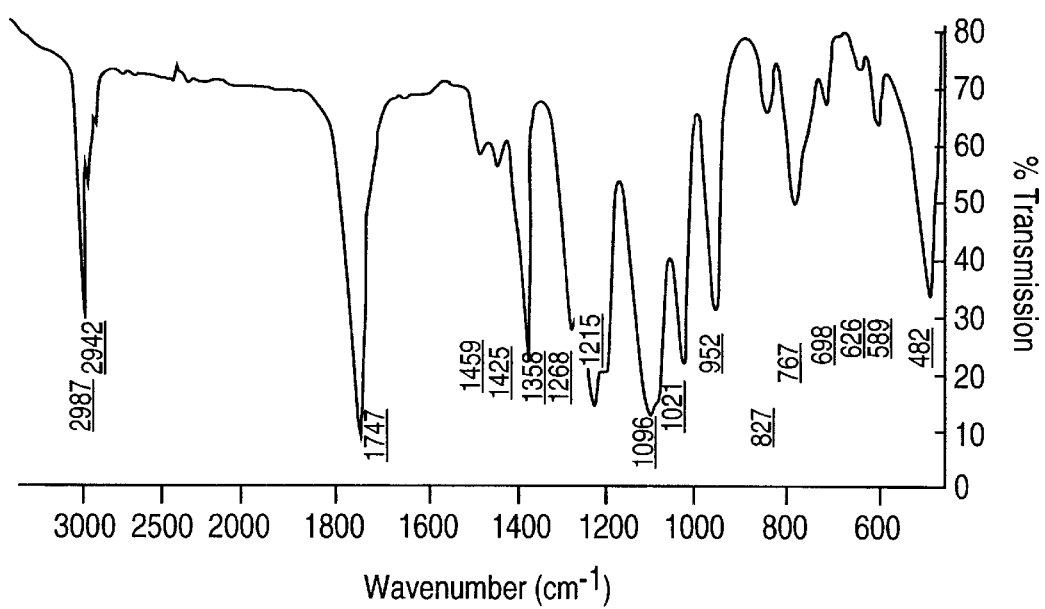
FIG. 7 shows the FTIR spectrum of DADBS deposited using a neat cell composed of NaCl single crystal salt plates.

FIG. 7 shows the IR spectrum of DADBS as deposited on NaCl. There are numerous absorption peaks. However, because neither the pure SiO$_2$ spectrum (FIG. 4), nor the nanocomposite spectrum (FIG. 6) showed any peak at 1747 cm$^{-1}$, there is little unpolymerized or undissociated DADBS present in these films. Thus, under the conditions of pyrolysis of this Example, the dissociation of the precursor was apparently complete.

Comparing FIGS. 4 (SiO$_2$) and 5 (PPXC) with FIG. 6 (nanocomposite) some additional peaks are apparent. The peaks 2974 cm$^{-1}$, 1248 cm$^{-1}$ and 1371 cm$^{-1}$ can be due to t-butanol, and the peak at 1708 cm$^{-1}$ can be due to acetic acid. Although present, these contaminants are minor. The peaks from 901 cm$^{-1}$ to 946 cm$^{-1}$ can be due to Si—OH bonding in the SiO$_2$ layer and the incorporation of t-butanol into the film. However, the nanocomposite films have very little acetic acid and t-butanol because of the use of a lower pyrolysis temperature of 615° C. than the temperature of 650° C. used for pure SiO$_2$ films. Any evidence of an oxide/polymer chemical bond, the Si—O—C bond, would be present in the same region as the large asymmetrically broadened peak of SiO$_2$ seen at 1072 cm$^{-1}$. Thus, if present, any Si—O—C bonds are not detectable using IR spectroscopy.

Example 3

Microscopic Structure of Nanocomposite Thin Films

A nanocomposite comprising silicon dioxide and poly (chloro-p-xylylene) deposited at about 80° C. was synthesized by a thermal CVD method using DADBS and DPXC as precursors. PPXC homopolymer films and the nanocomposite films were both grown directly on a copper TEM hexagonal grid (600 mesh, hole diameter 14 μm). Both the polymer-rich nanocomposite films and homopolymer organic films polymerized transversely across the grid to form a thin film. Transmission electron microscopy (TEM) micrographs were obtained using a Phillips EM-6210 TEM. The filament current was 20 mA and the accelerating voltage 100 kV. Both the PPXC and the nanocomposite micrograph negatives were taken at 50,800× and printed to achieve the final magnifications.

Figure 8:
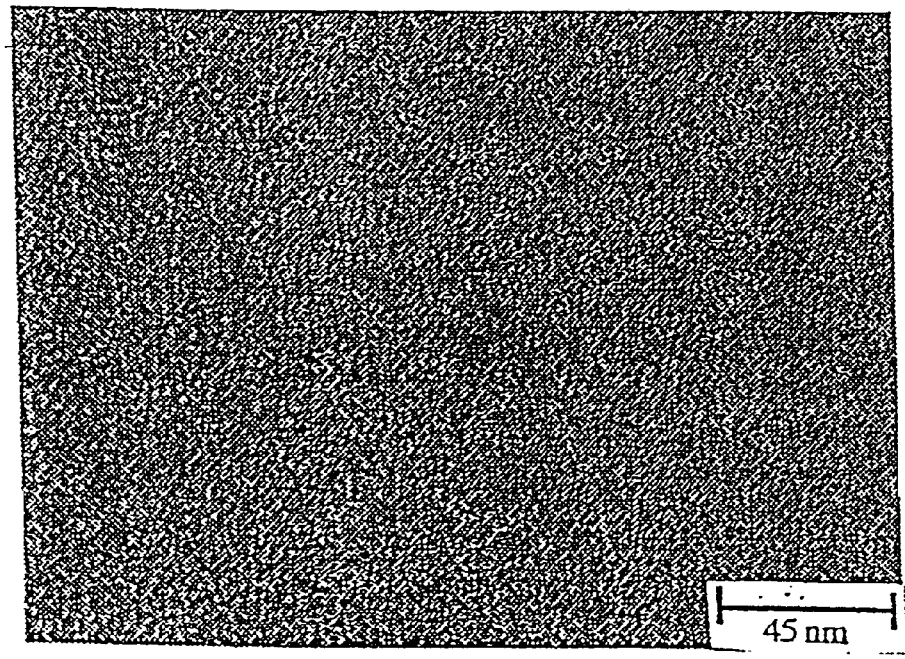
FIG. 8 is a transmission electron micrograph printed at a magnification of 432,800× of a thin film of 100% PPXC.
Figure 9:
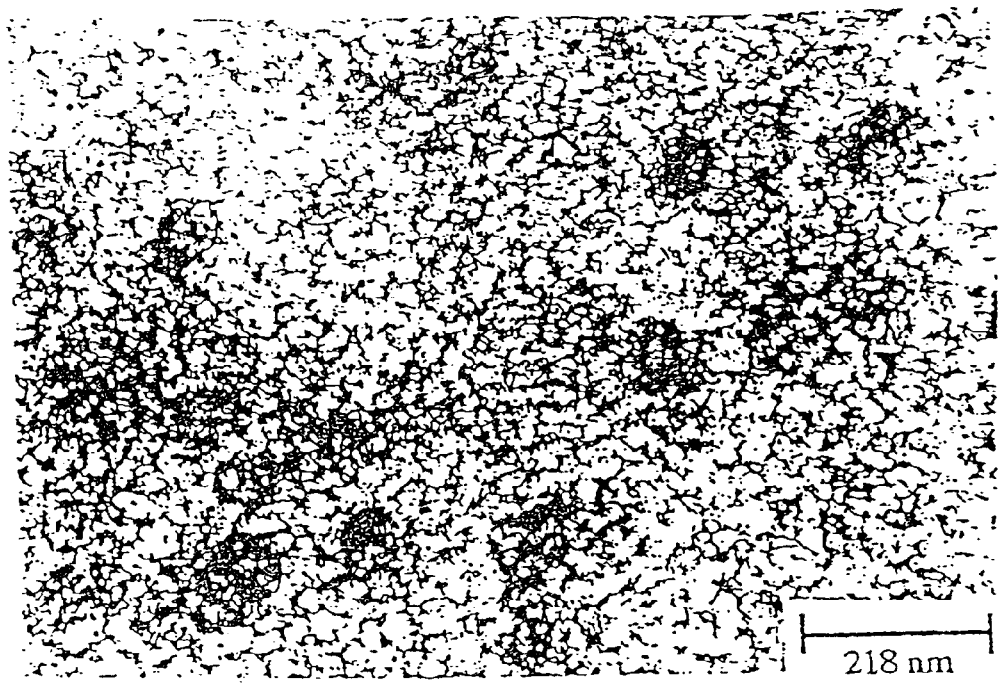
FIG. 9 is a transmission electron micrograph printed at a magnification of 229,500× of a thin nanocomposite film of 57% PPXC.

Comparing the electron micrographs for a film of 100% PPXC printed at a magnification of 432,800× (FIG. 8) and a 57 wt. % PPXC nanocomposite printed at a magnification of 92,000× (FIG. 9), significant morphological differences exist. In the PPXC homopolymer film (FIG. 8), no apparent morphological structures exist. However, the nanocomposite shows an interspersed nanophase morphology of SiO$_2$ and poly(chloro-para-xylylene). Dark regions in the matrix can represent SiO$_2$ because of the greater electron scattering power of SiO$_2$ as compared to PPXC. The dark regions range in size from about 5 nm to about 20 nm in diameter. These SiO$_2$ domains are dispersed throughout the continuous organic polymer phase.

Example 4

Post Deposition Annealing to Alter Nanocomposite Thin Film Structure

After deposition of nanocomposite thin films, the physical and chemical nature of the films can be altered by subsequent annealing of the films. Such annealing steps can be generally carried out at temperatures above the glass transition temperature (Tg) of the nanocomposite, to enable polymer chain mobility. To determine the chemical composition of thin films, wavelength dispersive X-ray analyses (WXDA) of the nanocomposite films were performed on Si(111) substrates and titanium magnetron sputter-coated Si(111) substrate. The thickness of the samples ranged from 132 nm to 178 nm for the nanocomposite samples and was 302 nm for the PPXC sample.

Figure 10:
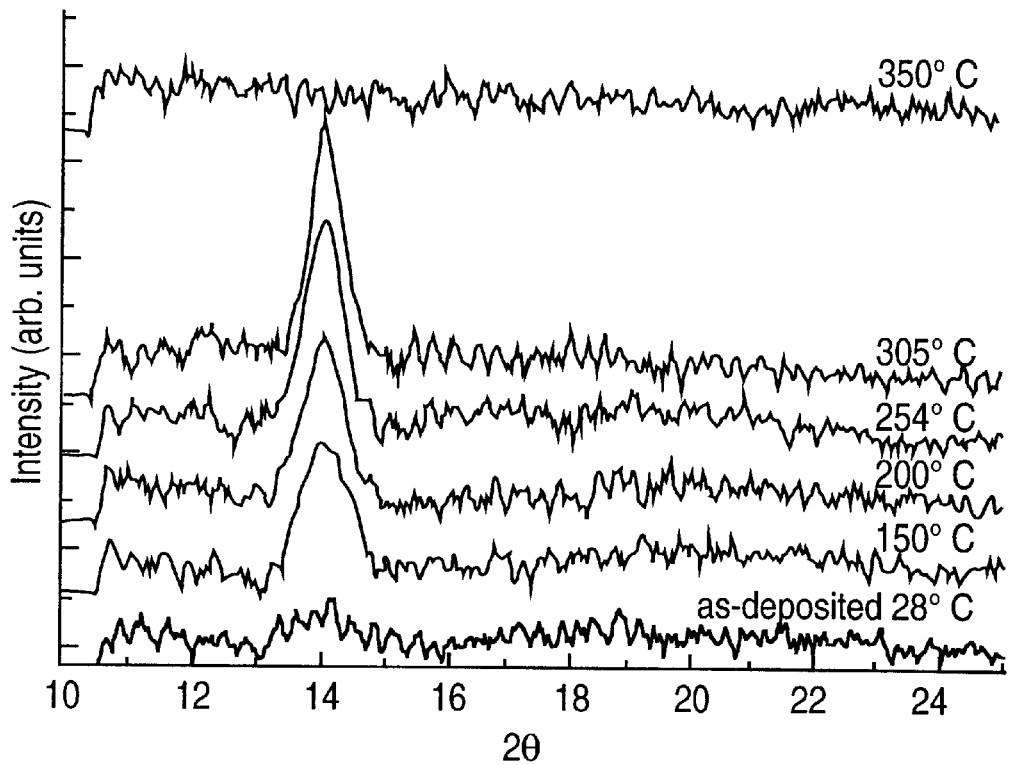
FIG. 10 shows the X-Ray Diffraction (XRD) spectra of a 100% PPXC nanocomposite thin film 302 nm in thickness before and after annealing at progressively higher temperatures.
Figure 11:
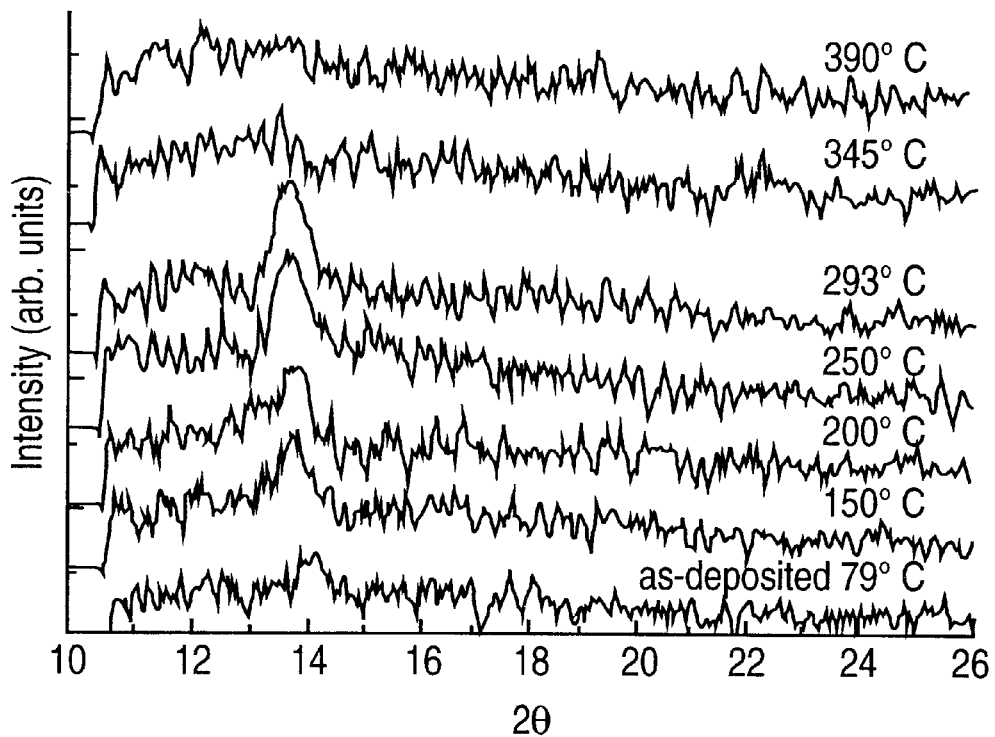
FIG. 11 shows the XRD spectra of a 91% PPXC nanocomposite thin film 828 nm in thickness before and after annealing at progressively higher temperatures.
Figure 12:
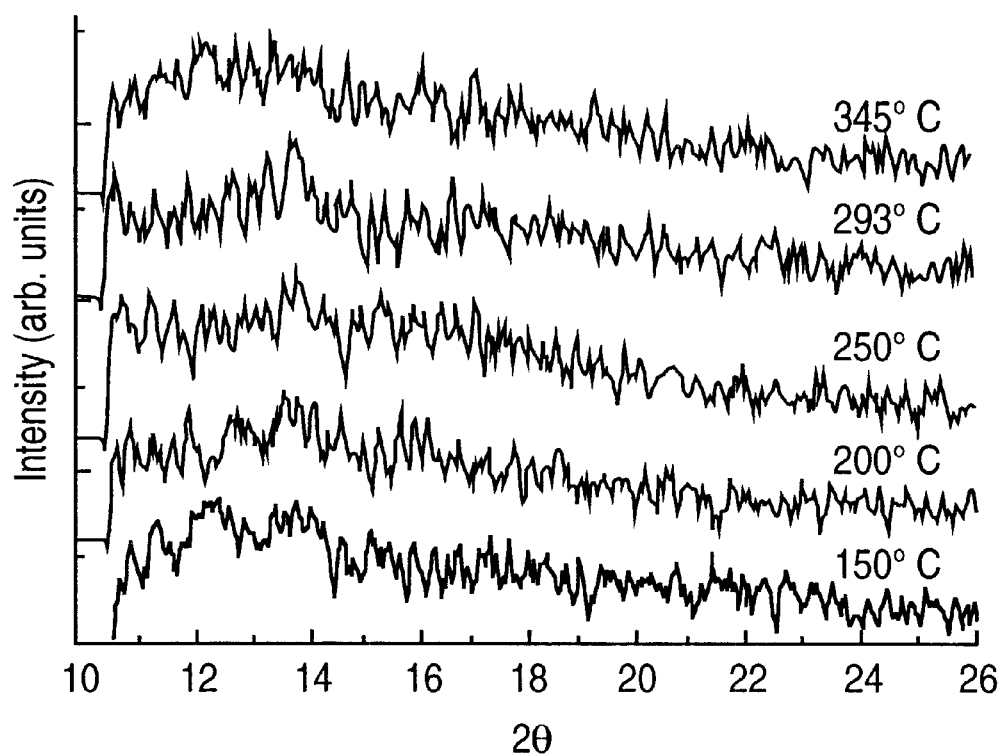
FIG. 12 shows the XRD spectrum of a 73% PPXC nanocomposite thin film 472 nm in thickness.

XRD was used to elucidate the crystallite structure of the polymer phase of the nanocomposite films. FIGS. 10, 11, and 12 show the XRD spectra of PPXC and the nanocomposite thin films, respectively. The homopolymer PPXC thin film shown in FIG. 10 was deposited at 28° C. and then subjected to post-deposition annealing steps of 1 hour duration each at 150° C., 200° C., 254° C., 305° C., and finally 350° C. The 2θ value of 13.99° (d-spacing=6.325 Å; b=1 2.65 Å where b=d/2) for the as-deposited PPXC, 302 nm thin film, closely matched the theoretical value of 13.95° for the (020) diffraction peak of the monoclinic unit cell with dimensions of a =5.96 Å; b=12.69 Å; c=6.66 Å; and β=13 5.2°. Thus, the film is comprised of crystallized polymers of PPXC. Subsequent annealing of the film resulted in progressive increases in the height of the peak at about 14 2θ, indicating that with annealing, the crystallinity of the film increased. However, after heating to a temperature above the melting temperature for PPXC of about 290° C., the peak disappeared. Thus, the crystal structure was interrupted and the film became more amorphous.

FIG. 11 shows the XRD spectra of a 91% PPXC nanocomposite thin film. The film was deposited at 79° C., and thereafter was exposed to annealing steps performed at temperatures of 150° C., 200° C., 250° C., 293° C., 345° C., and 390° C. The as-deposited film shows a small peak around 14 2θ, corresponding to a d-spacing of about 6.172 Å. Post-deposition annealing increased the size of this peak progressively until a temperature of 304° C. was reached, and when heated to above the glass transition temperature, the peak disappeared.

FIG. 12 shows the XRD spectra of a 73% PPXC nanocomposite thin film. The film was deposited, and thereafter exposed to annealing steps performed at temperatures of 150° C., 200° C., 250° C., 293° C., and 345° C. The as-deposited film shows a small, rough peak around 13 to 14 2θ, corresponding to a d-spacing of about 6.172 Å. Post-deposition annealing increased the size of this peak progressively but to a much smaller degree than observed for the 100% PPXC or 91% PPXC films until a temperature of 345° C. was reached, at which point, the peak disappeared. Additionally, the XRD spectra of this film showed a broader rise at 13 to 14 2θ, indicating that the crystallite size was smaller for the 73% PPXC film than for either the 100% PPXC or 91% PPXC films.

Thus, similar to the 100% PPXC film, the polymer-rich nanocomposite films have detectable crystalline structure which is increased by low and moderate temperature annealing, but when heated to above the melting temperature, the crystal structure was interrupted, resulting in more amorphous films.

Moreover, the nanocomposite films showed the same d-spacing as the PPXC homopolymer at the same post-deposition anneal temperatures. However, the average crystallite size and percent crystallinity were different, reflecting a different morphology of the films.

Crystallite size was determined for PPXC homopolymer and nanocomposite thin films using the well known Scherrer formula:

$$B = \frac{\lambda 0.9}{\cos\theta t}$$

where λ is the wavelength of the x-ray radiation, θ is the center of the XRD peak in radians, t is the mean diameter of the crystallites, and B is the broadening of the diffraction peak measured by its full width at half maximum (FWHM) according to the methods of Cullity, *Elements of X-Ray Diffraction,* Addison-Wesley, Reading Mass. pp. 284 (1978), incorporated herein fully by reference.

For PPXC homopolymer thin films, a crystallite size of 185 Å was calculated for the as-deposited sample; and crystallite sizes of 335 Å and 351 Å were calculated for the films annealed at 150° C. and 200° C., respectively.

The average crystallite sizes for the 91% polymer nanocomposite thin films were 159 Å, 220 Å, and 330 Å, for the films studied as-deposited and after annealing at either 150° C. or 200° C., respectively. Thus, the PPXC homopolymer and the nanocomposite thin films have the same d-spacing; however, the average crystallite size was much different as calculated by the Scherrer formula.

Figure 13:
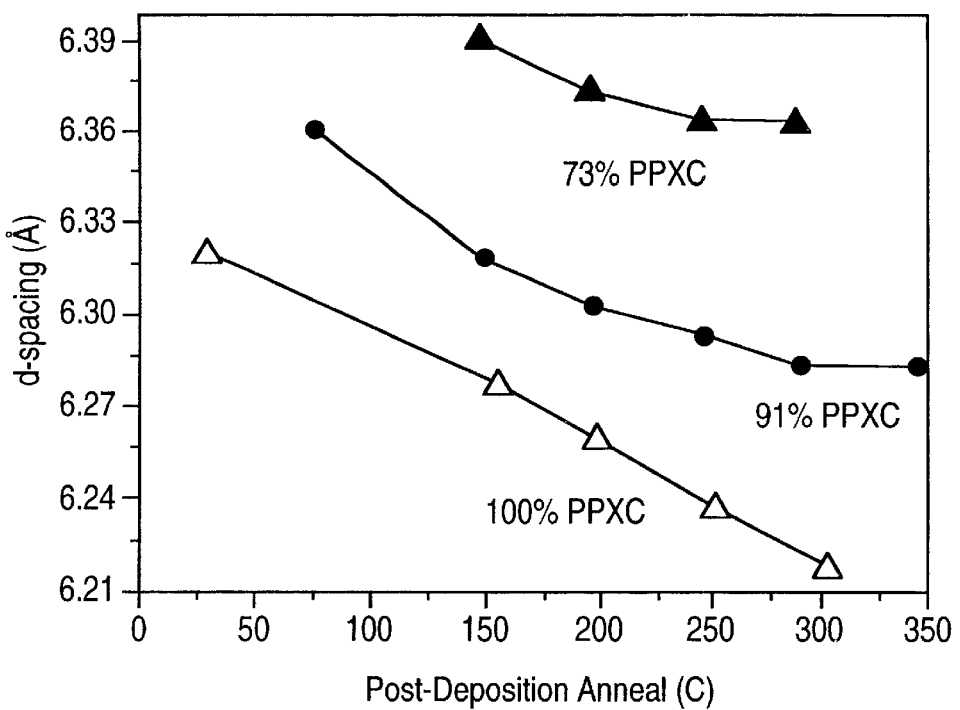
FIG. 13 shows the relationship of d-spacing of crystallites and post-deposition annealing temperatures of nanocomposite thin films containing PPXC.

FIG. 13 shows the relationship between annealing temperature and d-spacing of crystallites in PPXC homopolymer and nanocomposite films. The 100% PPXC film had a d-spacing of about 6.36 as deposited, and that d-spacing decreased with progressively higher annealing temperatures (Δ). The 91% PPXC nanocomposite film (●) had a larger d-spacing which decreased at each annealing temperature, and with progressively increasing annealing temperatures, however, the d-spacing decrease was less than for the 100% PPXC film. The 73% PPXC nanocomposite film (▲) had an even higher d-spacing than the 91% PPXC film, and with increasing annealing temperatures, the decrease in d-spacing was very small. One possible theory to account for the observations is that with increasing $SiO_2$ content of the nanocomposite films, the $SiO_2$ constrains the polymer phase, limiting the mobility of the PPXC molecules. However, other theories may account for the observations, and the invention is not restricted to any particular theory for operability.

The as-deposited polymer has been shown to have a high degree of paracrystallinity which becomes much improved after post-deposition annealing, especially at significantly higher temperatures above the Tg. (Senkevich et al., *Appl. Phys. Lett.* 72(2):258–260 (1998), incorporated herein fully by reference). The decreases in d-spacing with increasing annealing are due to the formation of more perfect crystalline structures which are denser and more tightly packed. This change is pronounced for the 100% PPXC and 91% PPXC films. One theory to account for this observation is that with progressive annealing, more time existed for molecular rearrangements to take place. However, other theories may account for this observation, and the invention is not limited to any particular theory for operability.

However, for the 73% PPXC film, little crystallite growth occurred with progressive annealing. A theory which may account for the differences in crystallinity is that constrainment of PPXC crystal structure was induced by $SiO_2$. This constrainment can reduce the mobility of the polymeric phase thereby reducing the crystallite growth rate. This constrainment would be expected to be more prominent for films containing more $SiO_2$.

Moreover, for all films studied, annealing at temperatures of 350° C. produced an amorphous thin film as reflected in the loss of an apparent peak around 14° 2θ. Apparently, annealing films at temperatures above the Tg of PPXC causes morphological changes in the polymer and therefore it cannot re-crystallize easily.

Figure 14:
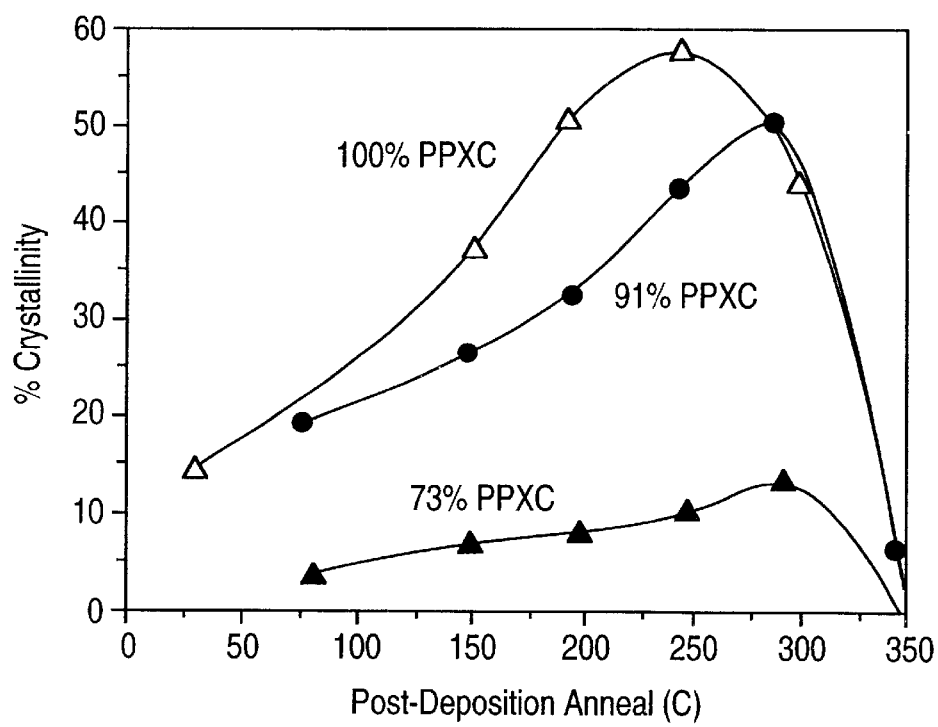
FIG. 14 shows the relationship of percent crystallinity to post-deposition temperature for PPXC-containing thin films.

FIG. 14 shows the relationship between film composition and percent crystallinity. The crystallinity of the 100% PPXC film increased with increasing annealing temperature and duration (Δ), with a peak crystallinity observed after annealing at 250° C. Thereafter, further annealing decreased crystallinity, as the film became more amorphous. Similarly, the 91% PPXC nanocomposite film exhibited increased crystallinity with progressive annealing (●), with a peak observed after annealing at about 300° C. As with the 100% PPXC film, the 91% PPXC nanocomposite film showed decreasing crystallinity with further annealing at temperatures above the Tg for PPXC. In contrast, the 73% PPXC nanocomposite (▲) showed little increase in crystallinity with annealing.

Figure 15:
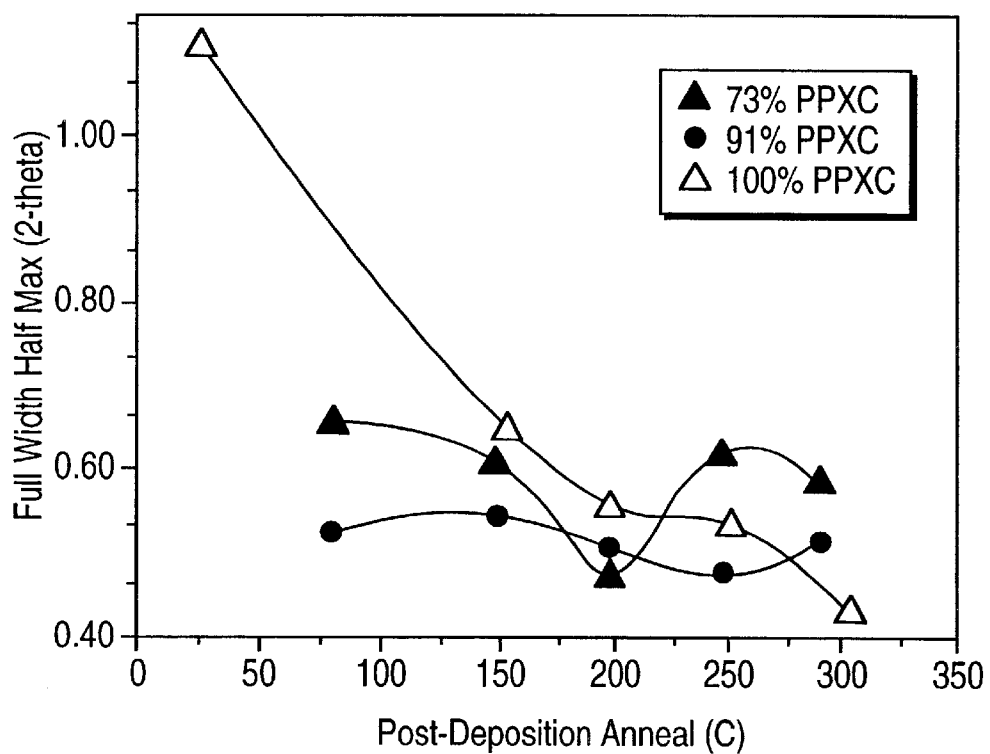
FIG. 15 shows the relationship between X-ray diffraction plane peak full width half maximum and post-deposition annealing temperature for PPXC-containing thin films.

FIG. 15 shows the full width half maximum at 2θ for 100% PPXC and nanocomposite thin films. The full width at half maximum (FWHM) can relate to a polymer's morphology. Three factors can influence the FWHM for a thin film material, (1) stress on the film, (2) the degree of crystal disorder, and (3) crystallite size. Of these, the change in d-spacing for a thin film material can be most influenced by the degree of crystal disorder. A decrease in crystal disorder, an increase in crystallite size, and a decrease in stress can all decrease the FWHM.

The 100% PPXC film (Δ) had the greatest full width half maximum at 2θ, and this decreased progressively with annealing. This decrease in FWHM can be due to a decrease in the d-spacing and an increase in crystallite size. In contrast, the nanocomposite films made with either 91% PPXC (●) or 73% PPXC (▲) showed little dependence on annealing of full width half maximum at 2θ, and had smaller crystallite sizes than did the 100% PPXC film.

A higher degree of constrainment imposed by larger crystallites and higher stress can increase the mechanical rigidity at higher temperatures (e.g., around about 200° C.). This constrainment in the polymer phase can also result in a slight increase in its dielectric constant.

Example 5
Physical Characteristics of Nanocomposite Thin Films

The thermogravimetric analysis (TGA) of 100% PPXC and nanocomposite thin films was performed on a Perkin Elmer TGA and a Seiko Instruments TGA in both air and nitrogen environments. The scanning rate was 10° C./min and the samples were heated to 550° C. Sintered polycrystalline NaCl substrates were used to deposit samples of nanocomposites for the TGA. Once deposited, the edges of the NaCl substrate were sanded off and they were dissolved in water until the film floated free and was recovered for further study. Some residual NaCl was retained by the film and this caused water adsorption due to its hygroscopic nature. The films were placed in a furnace at 130° C. for 1.5 hours to evaporate the water.

Figure 16:
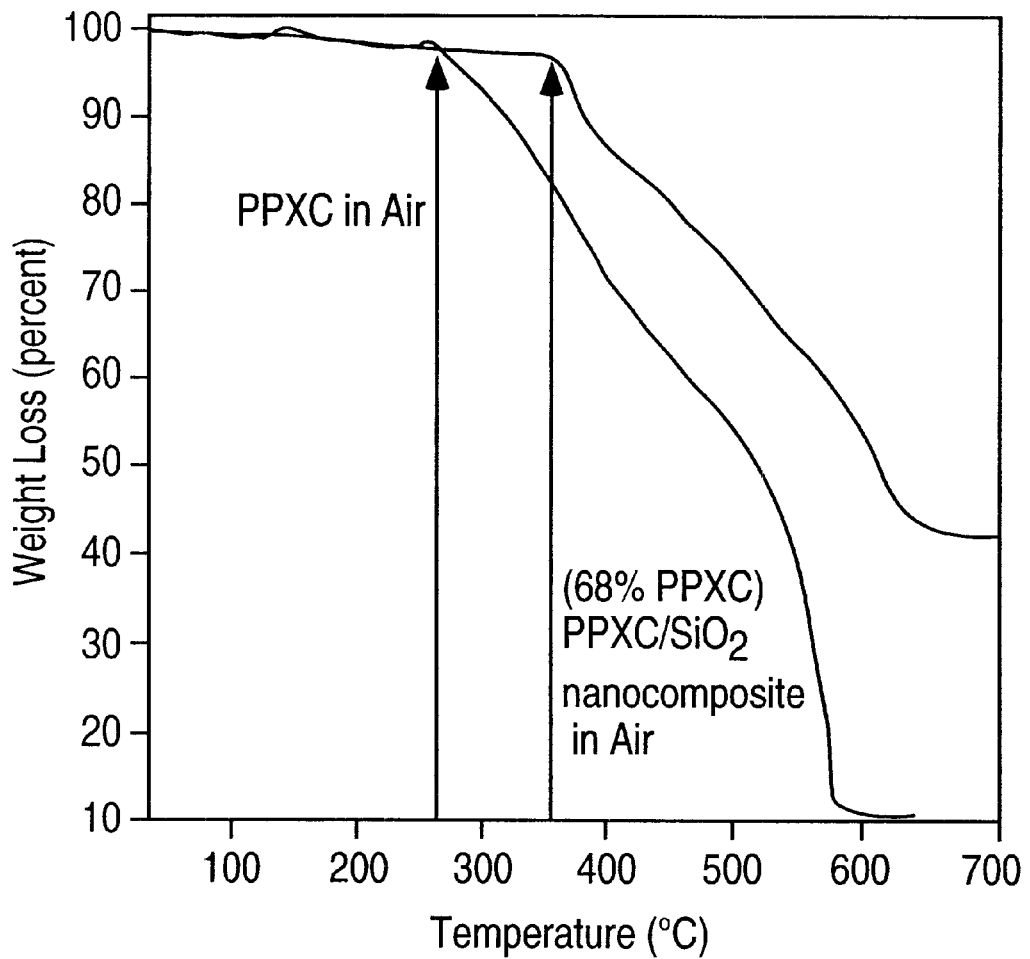
FIG. 16 shows the relationship between thermal stability and temperature for thin films of pure PPXC and nanocomposite films containing PPXC and $SiO_2$.

FIG. 16 shows the effect of temperature on weight loss of nanocomposite films of 68% PPXC and 100% PPXC in air. The pure PPXC film and the nanocomposite film showed minimal weight loss up to temperatures of about 275° C. The pure PPXC film lost weight rapidly with increasing temperatures above about 275° C., however. In contrast, the nanocomposite film was stable up to a temperature of about 370° C. Thus, the nanocomposite film is more temperature insensitive than the pure PPXC film.

The foregoing examples are by way of illustration only, and are not intended to limit the scope of the invention. The above-mentioned theories to account for the observations may not be the only ones possible. Other theories may account for the observations, and the invention is not limited to any particular theory for operability.

The references cited above are incorporated herein fully by reference.

We claim:

1. A method for manufacturing a composite dielectric material comprising:

selecting a precursor of a metal oxide dielectric material selected from the group consisting of aluminum (III) n-butoxide, yttrium isopropoxide, titanium-di-n-butoxide (bis-2,4-pentanedionate), zirconium isopropoxide, tantalum (V) n-butoxide, niobium (V) n-butoxide, and zinc n-butoxide;

selecting an organic parylene copolymer dielectric material or an organic polymer dielectric material selected from the group consisting of poly(para-xylylene), poly (chloro-para-xylylene), poly(dichloro-para-xylylene) and poly(tetrafluoro-para-xylylene); and co-depositing the metal oxide with the organic polymer or copolymer.

2. The method of claim 1 wherein said step of co-deposition is carried out using chemical vapor deposition.

3. The method of claim 1 wherein the oxide dielectric material is polymerized on a substrate at a temperature in the range of from about 25° C. to about 700° C.

4. The method of claim 1, wherein the organic polymer dielectric material forms crystallites and wherein the composite dielectric material forms a thin film.

5. The method of claim 4 wherein the organic polymer crystallites have sizes in the range of from about 20 Å to about 500 nm.

6. The method of claim 4 further comprising annealing the thin film at a temperature above the deposition temperature and below the glass transition temperature of the organic polymer dielectric material.

7. The method of claim 4, further comprising annealing the thin film at a temperature above the glass transition temperature of the organic polymer dielectric material.

8. The method of claim 1, wherein said step of co-depositing is carried out after dissociating each of said precursors using an energy source selected from the group consisting of thermal energy, plasma energy and photon energy.

9. The method of claim 1 wherein said co-deposition step comprises changing the deposition rate of said oxide relative to the deposition rate of said organic polymer.

10. The method of claim 9 wherein the relative amount of oxide and organic polymer is in the range of about 0.053:1 to about 19:1.

11. The method of claim 9, wherein the relative amounts of oxide and organic polymer in the range of about 0.25:1 to about 4:1.

12. The method of claim 9 wherein the relative amounts of oxide and organic polymer is in the range of about 0.6 to about 1.5.

13. The method of claim 1 wherein the copolymer is selected from the group consisting of poly(maleimide/poly (para-xylylene)) copolymer, poly acenaphthalene/poly(para-xylylene) copolymer, divinylbenzene/poly(para-xylylene) copolymer, perfluorooctylmethacrylate/poly(para-xylylene) copolymer, 4-vinyl biphenyl/poly(para-xylylene) copolymer, 9-vinylanthracene/poly(para-xylylene) copolymer, maleic anhydride/poly(para-xylylene) copolymer, N-vinyl pyrrolidone/poly(para-xylylene) copolymer, 4-vinylpyridine/poly(para-xylylene) copolymer, styrene/poly(para-xylylene) copolymer, buckminsterfullerene/poly(para-xylylene) copolymer, and trihydroperfluoroundecylmethacrylate/poly(para-xylylene) copolymer.

* * * * *